United States Patent
Lin et al.

(10) Patent No.: US 11,218,164 B2
(45) Date of Patent: *Jan. 4, 2022

(54) DATA STORAGE DEVICE AND NON-VOLATILE MEMORY CONTROL METHOD

(71) Applicant: Silicon Motion, Inc., Jhubei (TW)

(72) Inventors: Hsuan-Ping Lin, Taichung (TW); Jie-Hao Lee, Zhubei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/786,089

(22) Filed: Feb. 10, 2020

(65) Prior Publication Data

US 2020/0412379 A1 Dec. 31, 2020

Related U.S. Application Data

(60) Provisional application No. 62/866,051, filed on Jun. 25, 2019.

(30) Foreign Application Priority Data

Oct. 16, 2019 (TW) ................. 108137198

(51) Int. Cl.
*H03M 13/09* (2006.01)
*G06F 11/10* (2006.01)
*G06F 12/02* (2006.01)

(52) U.S. Cl.
CPC ....... *H03M 13/093* (2013.01); *G06F 11/1004* (2013.01); *G06F 12/0238* (2013.01); *G06F 2212/7201* (2013.01)

(58) Field of Classification Search
CPC . H03M 13/093; H03M 13/09; G06F 11/1004; G06F 12/0238; G06F 2212/7201;
(Continued)

(56) References Cited

U.S. PATENT DOCUMENTS 5,136,592 A 8/1992 Weng
5,696,929 A 12/1997 Hasbun et al.
(Continued)

FOREIGN PATENT DOCUMENTS

TW 201611007 A 3/2016
TW I661307 B 6/2019

OTHER PUBLICATIONS

Office Action dated Jun. 30, 2021 of U.S. Appl. No. 16/885,627.
(Continued)

*Primary Examiner* — Esaw T Abraham
*Assistant Examiner* — Enam Ahmed
(74) *Attorney, Agent, or Firm* — McClure, Qualey & Rodack, LLP

(57) ABSTRACT

Uncorrectable (UNC) marking on a non-volatile memory is provided. In response to a UNC marking command issued by a host, a cyclic redundancy check (CRC) engine provides a specific CRC code to mark a logical address segment as uncorrectable, wherein the logical address segment is requested to be marked as uncorrectable by the UNC marking command. As long as the specific CRC code is recognized, a CRC procedure is not required and the data requested by the host is directly determined as uncorrectable.

10 Claims, 6 Drawing Sheets

(58) Field of Classification Search
CPC ...... G06F 3/0658; G06F 3/0679; G06F 3/064; G06F 2212/7209; G06F 12/0246
USPC .......................................................... 714/758
See application file for complete search history.

(56) References Cited

U.S. PATENT DOCUMENTS

| | | | |
|---|---|---|---|
| 6,092,231 A | 7/2000 | Sze | |
| 6,606,682 B1 | 8/2003 | Dang et al. | |
| 8,245,101 B2* | 8/2012 | Olbrich | G11C 7/1051 |
| | | | 714/753 |
| 8,285,924 B1 | 10/2012 | Cohn et al. | |
| 8,533,384 B2 | 9/2013 | Olbrich et al. | |
| 8,904,090 B2 | 12/2014 | Baek et al. | |
| 9,870,836 B2 | 1/2018 | Ooneda | |
| 10,783,037 B2 | 9/2020 | Chang et al. | |
| 10,789,130 B1* | 9/2020 | Horspool | G06F 11/1435 |
| 2002/0165911 A1 | 11/2002 | Gabber et al. | |
| 2005/0268203 A1* | 12/2005 | Keays | G06F 11/10 |
| | | | 714/758 |
| 2007/0079103 A1 | 4/2007 | Mimatsu | |
| 2009/0077312 A1 | 3/2009 | Miura | |
| 2009/0228634 A1* | 9/2009 | Nakamura | G06F 11/1441 |
| | | | 711/103 |
| 2010/0005366 A1* | 1/2010 | Dell | G06F 11/073 |
| | | | 714/758 |
| 2010/0250855 A1 | 9/2010 | Watanabe et al. | |
| 2011/0072199 A1 | 3/2011 | Reiter et al. | |
| 2011/0238629 A1 | 9/2011 | Post et al. | |
| 2011/0320864 A1* | 12/2011 | Gower | G06F 11/2053 |
| | | | 714/6.12 |
| 2011/0320914 A1* | 12/2011 | Alves | G06F 11/1004 |
| | | | 714/770 |
| 2012/0144109 A1 | 6/2012 | Balakrishnan et al. | |
| 2013/0191703 A1* | 7/2013 | Meaney | G06F 11/10 |
| | | | 714/770 |
| 2014/0013182 A1* | 1/2014 | Cheng | H03M 13/2906 |
| | | | 714/758 |
| 2014/0108855 A1* | 4/2014 | Gopakumar | G06F 11/008 |
| | | | 714/6.2 |
| 2014/0279941 A1 | 9/2014 | Atkisson | |
| 2015/0169465 A1 | 6/2015 | Slepon | |
| 2015/0178201 A1 | 6/2015 | Sampathkumar et al. | |
| 2015/0207807 A1 | 7/2015 | Guo | |
| 2016/0078948 A1 | 3/2016 | Shirakawa | |
| 2016/0098344 A1 | 4/2016 | Gorobets et al. | |
| 2016/0098355 A1 | 4/2016 | Gorobets | |
| 2016/0117252 A1 | 4/2016 | Thangaraj et al. | |
| 2017/0308473 A1 | 10/2017 | Bassi | |
| 2017/0371794 A1 | 12/2017 | Kan | |
| 2018/0203627 A1* | 7/2018 | Gilda | G06F 1/3275 |
| 2018/0275887 A1 | 9/2018 | Yang et al. | |
| 2018/0285258 A1 | 10/2018 | Muchherla et al. | |
| 2019/0004960 A1 | 1/2019 | Wang et al. | |
| 2019/0026224 A1 | 1/2019 | Koo | |
| 2019/0079882 A1* | 3/2019 | Kim | G06F 3/0614 |
| 2019/0108120 A1 | 4/2019 | Kanno | |
| 2019/0155685 A1 | 5/2019 | Kim | |
| 2019/0347006 A1 | 11/2019 | Yeh et al. | |
| 2020/0233757 A1* | 7/2020 | Ferreira | G06F 11/1482 |
| 2020/0394099 A1* | 12/2020 | Lin | G06F 9/30032 |
| 2020/0409856 A1 | 12/2020 | Navon et al. | |

OTHER PUBLICATIONS

Non-Final Office Action dated Sep. 9, 2021, issued in U.S. Appl. No. 16/774,300.
Final Office Action dated Oct. 14, 2021, issued in application U.S. Appl. No. 16/774,207.
Final Office Action dated Oct. 15, 2021, issued in application U.S. Appl. No. 16/885,627.

* cited by examiner

DATA STORAGE DEVICE AND NON-VOLATILE MEMORY CONTROL METHOD

CROSS REFERENCE TO RELATED APPLICATIONS

This application claims the benefit of U.S. Provisional Application No. 62/866,051, filed on Jun. 25, 2019, the entirety of which is incorporated by reference herein.

This application also claims priority of Taiwan Patent Application No. 108137198, filed on Oct. 16, 2019, the entirety of which is incorporated by reference herein.

BACKGROUND OF THE INVENTION

Field of the Invention

The present invention is related to non-volatile memory control techniques.

Description of the Related Art

There are various forms of non-volatile memory (NVM) for long-term data storage, such as flash memory, magnetoresistive random access memory (RAM), ferroelectric RAM, resistive RAM, spin transfer torque-RAM (STT-RAM), and so on. These types of non-volatile memory may be used as the storage medium in a data storage device.

Non-volatile memory often uses a non-volatile memory express (NVMe) interface to communicate with a host. An uncorrectable (UNC) marking command (also referred to as a UNC write command, such as WriteUNC) is defined in the NVMe interface, by which the indicated logical address segment is programmed as uncorrectable (UNC marking). It is determined that the data read back from the non-volatile memory that has been mapped to the logical address segment is unreliable. The control of non-volatile memory must be capable of responding to such a special command defined in the NVMe interface.

BRIEF SUMMARY OF THE INVENTION

In the present invention, uncorrectable (UNC) marking is combined into a cyclic redundancy check (CRC) technique. A specific cyclic redundancy check code (which may be a fixed code) may be used to indicate an uncorrectable situation. As long as the specific cyclic redundancy check code is recognized, a CRC procedure is not required and the data requested by the host is directly determined to be uncorrectable.

A data storage device in accordance with an exemplary embodiment of the present invention includes a non-volatile memory and a controller configured to control the non-volatile memory. The controller has a cyclic redundancy check engine. In response to an uncorrectable marking command issued by the host, the controller operates the cyclic redundancy check engine to provide a specific cyclic redundancy check code to mark a logical address segment indicated by the uncorrectable marking command as uncorrectable.

In accordance with an exemplary embodiment, the controller uses a mapping information format to manage mapping information with each management unit involving a plurality of logical address units. The cyclic redundancy check engine assigns the specific cyclic redundancy check code to each logical address unit in the logical address segment to mark all logical address units in the logical address segment as uncorrectable.

In accordance with an exemplary embodiment, an uncorrectable marking unit introduced by the uncorrectable marking command is smaller than the management unit introduced by the mapping information format.

In accordance with an exemplary embodiment, the controller programs the specific cyclic redundancy check code to the non-volatile memory for each logical address unit in the logical address segment. The specific cyclic redundancy check code is programmed to a metadata area of the non-volatile memory.

In accordance with an exemplary embodiment, in response to a read command issued by the host, the controller reads the non-volatile memory to get read data and get read cyclic redundancy check code. When the cyclic redundancy check engine determines that the read cyclic redundancy check code is identical to the specific cyclic redundancy check code, the controller informs the host that uncorrectable data is being requested by the read command.

When the cyclic redundancy check engine determines that the read cyclic redundancy check code is different from the specific cyclic redundancy check code and fails cyclic redundancy checking, the controller may return a cyclic redundancy check failure message to the host.

When the cyclic redundancy check engine determines that the read cyclic redundancy check code is different from the specific cyclic redundancy check code and passes the cyclic redundancy checking, the controller may return the read data to the host.

The aforementioned controller may be implemented in other architectures. The foregoing concept can be used to implement a non-volatile memory control method, which includes the following steps: in response to an uncorrectable marking command issued by a host, operating a cyclic redundancy check engine to provide a specific cyclic redundancy check code; and marking that a logical address segment indicated by the uncorrectable marking command is uncorrectable by using the specific cyclic redundancy check code.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive random access memory (RAM), a ferroelectric RAM, a resistive RAM, a spin transfer torque-RAM (STT-RAM) and so on. The following discussion uses flash memory as an example.

Today's data storage devices often use flash memory as the storage medium for storing user data from the host. There are many types of data storage devices, including memory cards, universal serial bus (USB) flash devices, solid-state drives (SSDs), and so on. In another exemplary embodiment, a flash memory may be packaged with a controller to form a multiple-chip package called eMMC (embedded multimedia card).

A data storage device using a flash memory as a storage medium can be applied in a variety of electronic devices, including a smartphone, a wearable device, a tablet computer, a virtual reality device, etc. A calculation module of an electronic device may be regarded as a host that operates the data storage device equipped on the electronic device to access the flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

Flash memory has its special storage characteristics which are described below. The host side distinguishes data by logical addresses (for example, logical block addresses LBAs or global host page numbers GHPs . . . ). The following uses LBA as an example of a logical address unit for description. As for where the data is actually stored in the flash memory, it is managed by mapping information.

Figure 1:
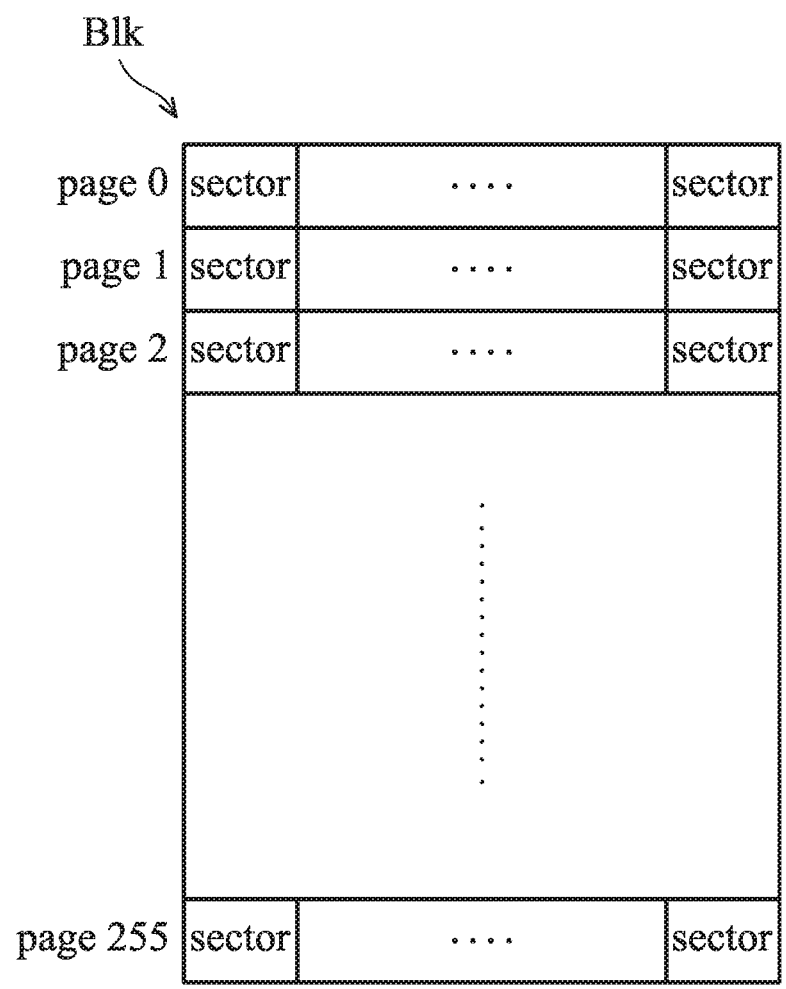
FIG. 1 illustrates the architecture of one block BLK.

The physical space of a flash memory is divided into a plurality of blocks. FIG. 1 illustrates the architecture of one block BLK, which includes a plurality of pages (e.g., page 0 to page 255). Each page includes a plurality of sectors (e.g., 32 sectors per page), and each sector may store 512 B user data. A single write may cover multiple sectors. In a 4 KB data management mode, each data unit covers 8 sectors (4 KB) and the 8 sectors are managed together. A 16 KB page stores four data units (32 sectors). One implementation is to sequentially program a block according to the page number (from low to high). In particular, data is not updated to the storage space of the old data. The new version of the data must be written into a blank space and the old data is invalidated. A block may only have sporadic valid data remained.

As a block cannot be reused until it is erased, the spare blocks are gradually consumed. When the number of spare blocks is insufficient (for example, less than a threshold amount), a garbage collection demand occurs. Sporadic valid data in a block is collected into another block (e.g., an active block) through garbage collection. Blocks with only invalid data remained is erased as a spare block, and so that the number of spare blocks is increased to ensure the normal use of the flash memory.

As can be seen from the foregoing, the space allocation of flash memory is quite complicated. In an exemplary embodiment, a logical-to-physical address mapping table (L2P mapping table) is established, which maps logical addresses (e.g. LBAs) recognized at the host side to physical addresses of the flash memory.

Figure 2:
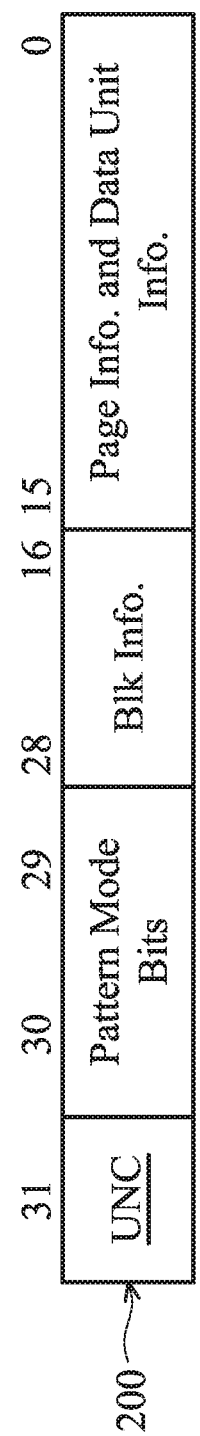
FIG. 2 illustrates a mapping information format 200 used in the conventional technology.

FIG. 2 illustrates a mapping information format 200 used in the conventional technology, including 32 bits (four bytes). The 4 B mapping information corresponds to 4 KB of data. A physical address contained in the 4 B mapping information points to the storage space of the 4 KB data. The conventional mapping information format 200 includes:

Bit [31], a UNC (uncorrectable) flag bit reserved to indicate unreliable mapping information, (for example, to mark the 4 KB data indicated by the 4 B mapping information as uncorrectable by changing the UNC flag bit from "0" to "1");

Bits [30:29], reserved for setting a pattern mode, wherein '00' or '01' represents that the subsequent bits [28:0] shows a physical address of the flash memory, and '10' represents that the subsequent bits [28:0] shows a physical address of a temporary storage, '11' represents that the following bits [28:0] shows dummy mapping information; and Bits [28:0], showing the physical address of the flash memory or the temporary storage, or showing dummy mapping information.

Note that the UNC flag bit [31] marks the whole 4 KB data as uncorrectable and is incapable of marking only 512 B data as uncorrectable. In other words, the use of UNC marking command (such as the WriteUNC command) is limited. A UNC marking command for a logical address segment smaller than a management unit (e.g., 4 KB) of the mapping information format will not be executed or responded correctly.

In the disclosure, UNC marking is combined into cyclic redundancy check (CRC) encoding. Through CRC encoding, a predetermined length (e.g. 2 B) of cyclic redundancy check code may be generated. A specific cyclic redundancy check code that is fixed without changing with the data to be encoded may be applied for UNC marking. In particular, the CRC encoding length may depend on the users. For example, the CRC encoding length may be as small as 512 B, or up to 4 KB, or the other data length. Regardless of the CRC encoding length, the 2 B specific cyclic redundancy check code may be reproduced as the corresponding cyclic redundancy check code. In this manner, the UNC marking combined in CRC encoding is much more flexible in comparison with the UNC flag bit (bit [31]) in the mapping information format 200. A UNC marking command for a logical address segment smaller than the management unit (e.g., 4 KB) of mapping information, therefore, are executed or responded correctly.

For example, when bit [31] of the mapping information format 200 is changed from "0" to "1", all data of LBA #0 to LBA #7 is marked as uncorrectable. It is incapable of marking the data of LBA #3 as uncorrectable alone. However, by combining UNC marking into CRC encoding, not only the all data of LBA #0 to LBA #7 can be marked as uncorrectable, the specific cyclic redundancy check code can be applied to the data of LBA #3 alone. It works to mark the data of LBA #3 as uncorrectable alone. Then, by recognizing the specific cyclic redundancy check code, it can be easily determined whether the all data of LBA #0 to LBA #7 is uncorrectable or only the data of LBA #3 is uncorrectable. A more flexible UNC marking, therefore, is achieved. An uncorrectable marking unit (e.g., 512 B) introduced by the uncorrectable marking command is smaller than the management unit (e.g., 4 KB) introduced by the mapping information format.

In an exemplary embodiment, the specific cyclic redundancy check code is preferably a value that cannot be generated by performing CRC encoding on general data. In another exemplary embodiment, the specific cyclic redundancy check code is a value generated from a specific data pattern such as dummy data. Once this specific cyclic redundancy check code is recognized, it means that the data requested by the read command is marked as uncorrectable (UNC). The specific cyclic redundancy check code is preferably different from the cyclic redundancy check code that results in CRC failure. In this way, CRC failure can be distinguished from a UNC mark.

Figure 3:
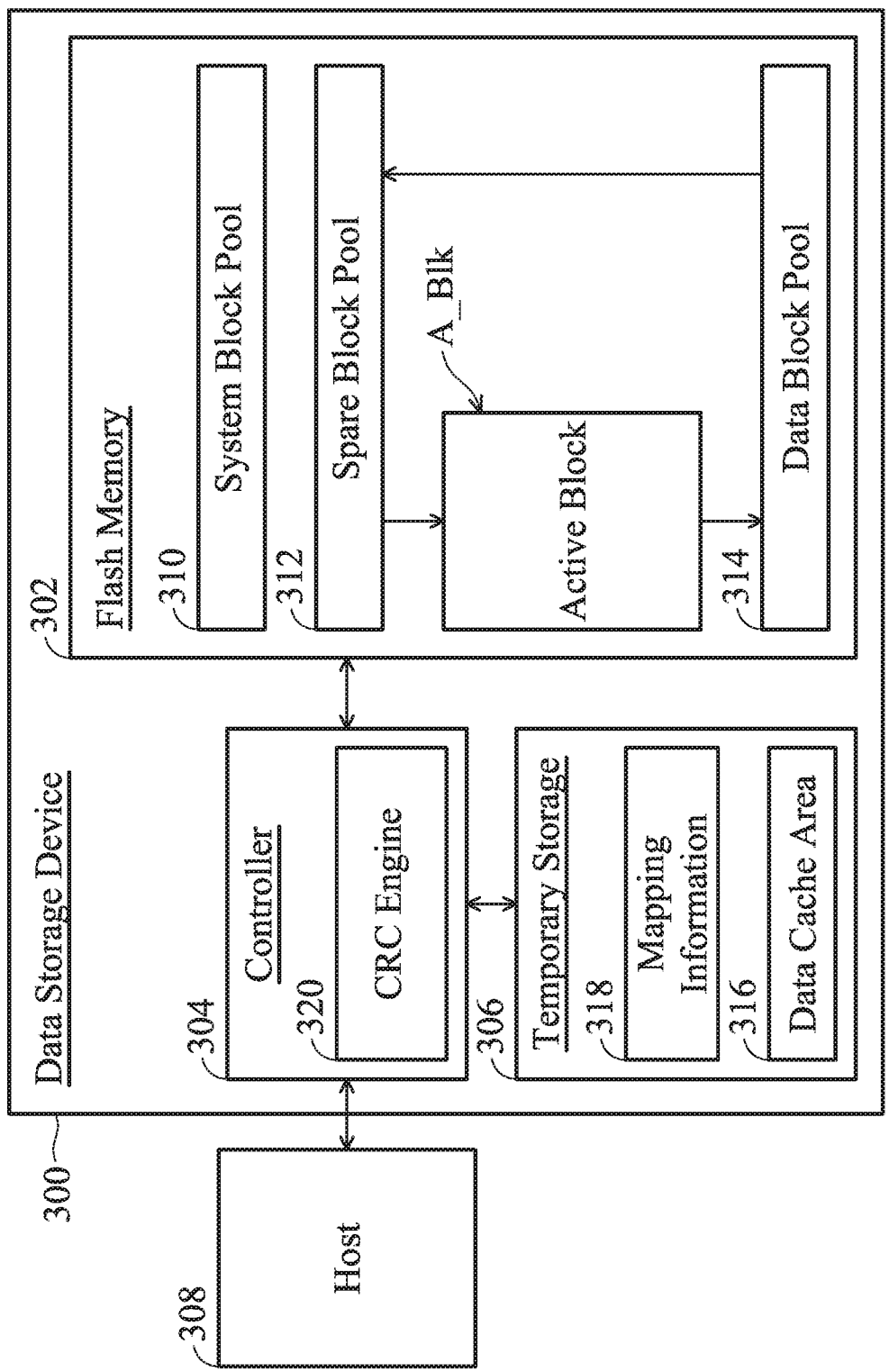
FIG. 3 is a block diagram illustrating a data storage device 300 in accordance with an exemplary embodiment of the present invention.

FIG. 3 is a block diagram illustrating a data storage device 300 in accordance with an exemplary embodiment of the present invention, which includes a flash memory 302, a controller 304, and a temporary memory 306. The host 308 operates the flash memory 302 through the controller 304. Within the data storage device 300, the controller 304 may spontaneously initiate the optimization of the flash memory 302, such as arranging the space of the flash memory 302 to maximize the storage performance. The controller 304 uses the temporary storage 306 to temporarily store the data required during calculations. The temporary storage 306 may be a dynamic random access memory (DRAM) or a static random access memory (SRAM).

The flash memory 302 includes a plurality of blocks. The blocks storing system information are pushed into a system information pool 310. An active block A_Blk taken from a spare block pool 312 is used to program the write data issued by the host 308. After the programming of the active block A_Blk is completed, the active block A_Blk is pushed into the data block pool 314 as a data block. After running for a period of time, some data may be updated frequently, leaving only sporadic valid data in some data blocks. These data blocks may be released by garbage collection and pushed back to the spare block pool 312.

Figure 4:
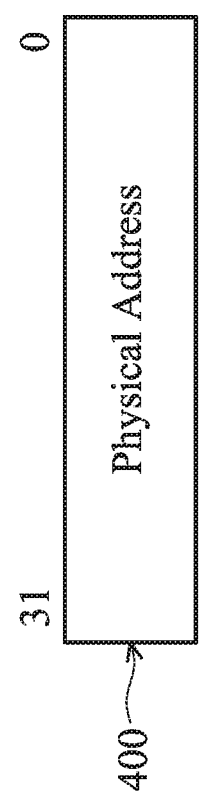
FIG. 4 illustrates a mapping information format 400 in accordance with an exemplary embodiment of the present invention.

As shown, the controller 304 first caches data in a data cache space 316 of the temporary storage 306, and then programs the cached data from the data cache space 316 to the active block A_Blk. The controller 304 may use the space 318 of the temporary storage 306 to temporarily store the mapping information, and the mapping information may be dynamically updated on the space 318. FIG. 4 illustrates a mapping information format 400 in accordance with an exemplary embodiment of the present invention. Mapping information is managed on the space 318 in the mapping information format 400, which does not reserve a UNC flag bit nor pattern mode bits. In the mapping information format 400, the all 32 bits [31:0] are used to represent a physical address. In another exemplary embodiment, only the UNC flag bit is omitted and the pattern mode bits are still reserved.

Figure 5:
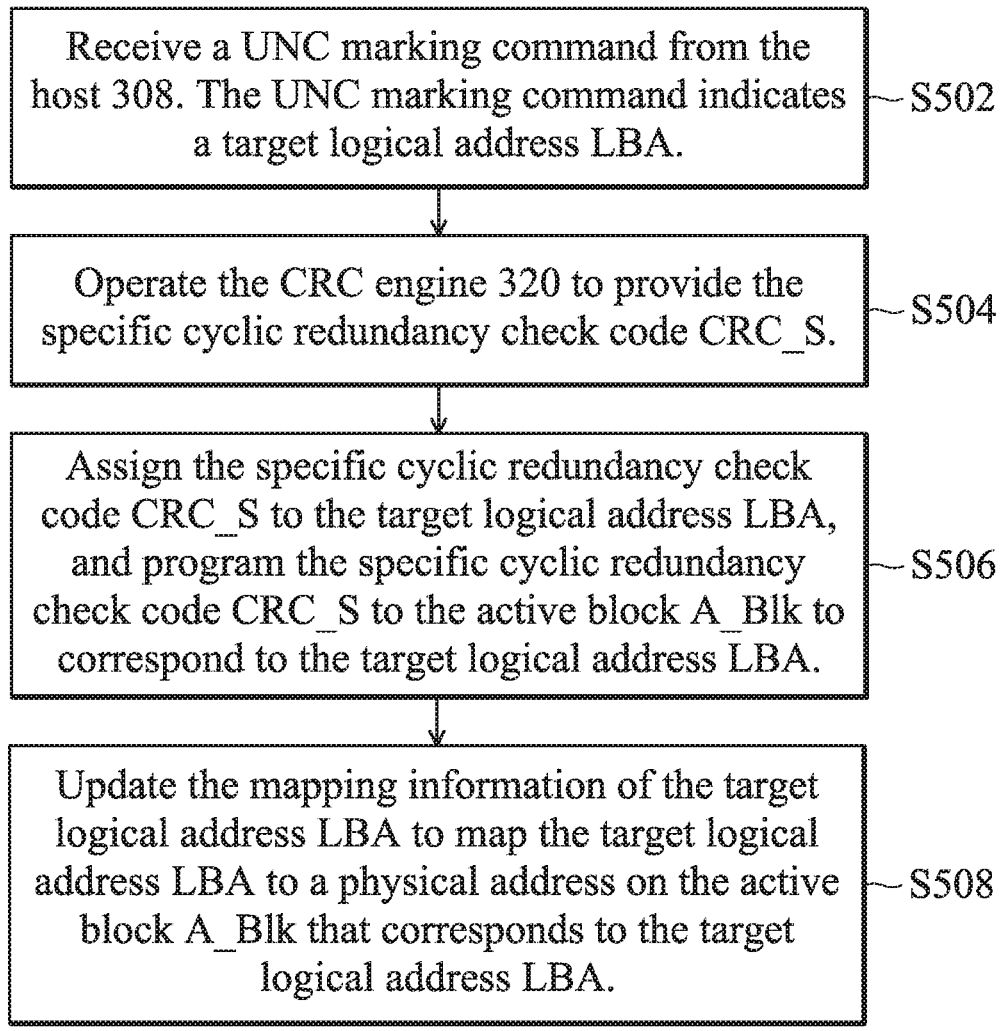
FIG. 5 is a flowchart illustrating how a UNC marking command is processed in accordance with an exemplary embodiment of the present invention.

FIG. 5 is a flowchart illustrating how a UNC marking command is processed in accordance with an exemplary embodiment of the present invention.

In step S502, the controller 304 receives a UNC marking command from the host 308. The UNC marking command indicates a target logical address (such as a target logical block address, hereinafter referred to as a target logical address LBA). For example, the controller 304 receives a UNC marking command, such as WriteUNC, from the host 308, and the UNC marking command indicates a target logical address LBA, such as LBA #3. The UNC write command may also indicate more than one target logical address LBAs, which are represented by a starting logical address LBA_S and a length L. For example, when the starting logical address LBA_S is LBA #0 and the length L is 8, the multiple target logical address LBAs are LBA #0 to LBA #7. The UNC marking command indicates a logical address segment (only one LBA or multiple LBAs) to be marked as uncorrectable.

In step S504, the controller 304 operates the CRC engine 320 to provide the specific cyclic redundancy check code CRC_S. The controller 304 includes a CRC engine 320, and the controller 304 outputs a data pattern P to the CRC engine 320 to generate the specific cyclic redundancy check code CRC_S. The data pattern P may be dummy data or another specific data. For example, the data pattern P may be all "0" or all "1". Thus, the CRC engine 320 outputs a specific CRC value as the specific cyclic redundancy check code CRC_S.

In step S506, the controller 304 assigns the specific cyclic redundancy check code CRC_S to the target logical address LBA, and programs the specific cyclic redundancy check code CRC_S to the active block A_Blk to correspond to the target logical address LBA. The controller 304 uses the data pattern P as the data corresponding to the target logical address LBA, and uses the specific cyclic redundancy check code CRC_S as the cyclic redundancy check code of the data pattern P. The controller 304 programs the data pattern P and specific cyclic redundancy check code CRC_S to the active block A_Blk. The data corresponding to the target logical address LBA may be programmed into a data area of the active block A_Blk, and the specific cyclic redundancy check code CRC_S may be programmed into a metadata area of the active block A_Blk.

In step S508, the controller 304 updates the mapping information of the target logical address LBA. The controller 304 updates the mapping information of the target logical address LBA to map the target logical address LBA to a physical address on the active block A_Blk that corresponds to the target logical address LBA. Then, when the host 308 requests to read the data of the target logical address LBA, the controller 304 reads the specific cyclic redundancy check code CRC_S from the metadata area of the active block A_Blk according to the mapping information, and reply to the host 308 that the target logical address LBA is uncorrectable due to the specific cyclic redundancy check code CRC_S. The purpose of the present invention, therefore, is achieved.

Figure 6:
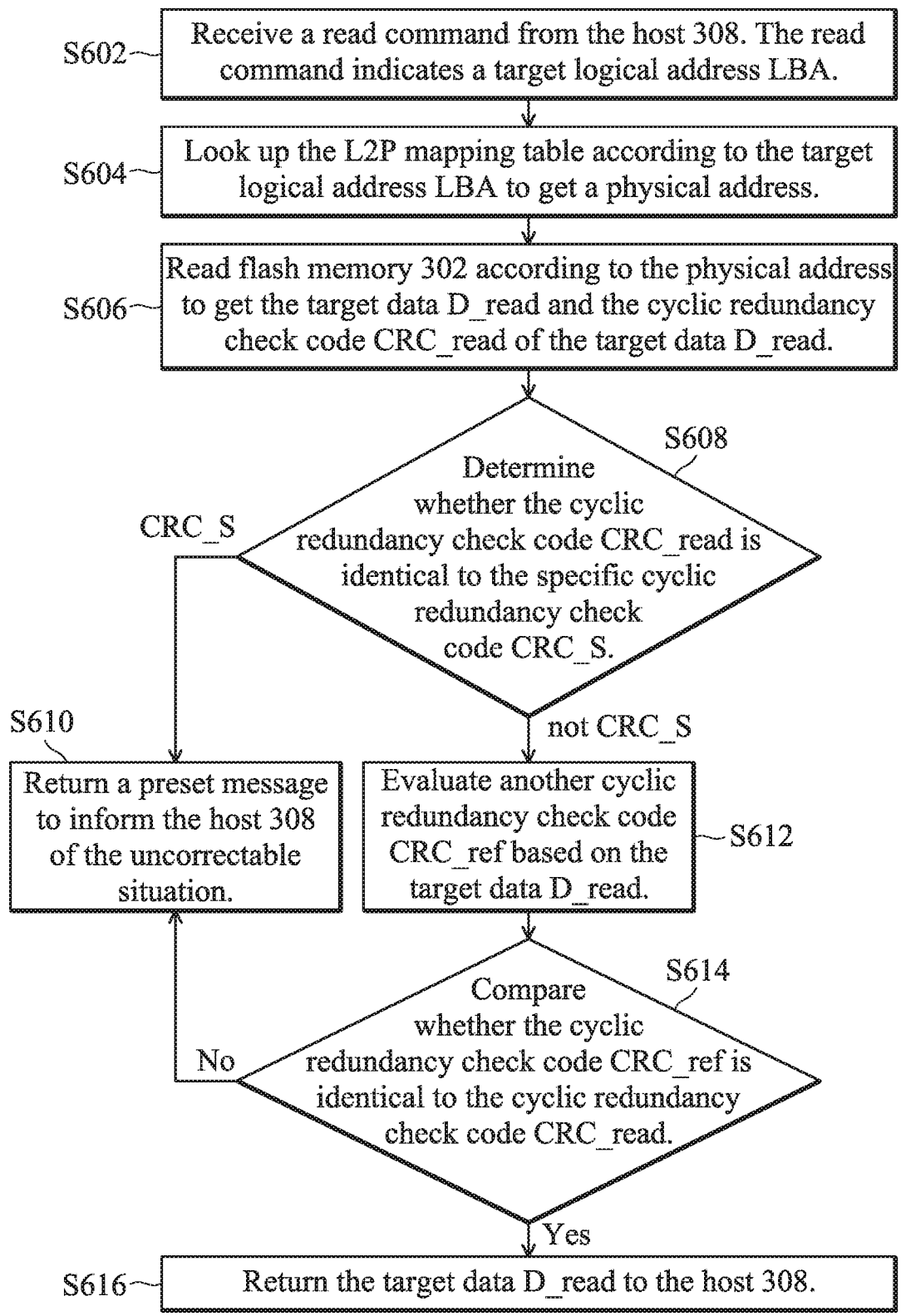
FIG. 6 is a flowchart illustrating how the controller 304 responds to a read command issued by the host 308 in accordance with an exemplary embodiment of the present invention.

FIG. 6 is a flowchart illustrating how the controller 304 responds to a read command issued by the host 308 in accordance with an exemplary embodiment of the present invention.

In step S602, the controller 304 receives a read command from the host 308. The read command indicates a target logical address LBA, for example: LBA #3.

In step S604, the controller 304 looks up the L2P mapping table according to the target logical address LBA to get a physical address. For example, the controller 304 looks up the L2P mapping table according to the logical address LBA #3 to get the physical address at which the data of the logical address LBA #3 stores.

In step S606, the controller 304 reads flash memory 302 according to the physical address to get the target data D_read and the cyclic redundancy check code CRC_read of the target data D_read. The controller 304 reads a data area and a metadata area at the physical address to get the target data D_read and the cyclic redundancy check code CRC_read, respectively.

In step S608, the controller 304 determines whether the cyclic redundancy check code CRC_read is identical to the specific cyclic redundancy check code CRC_S, and if so, it executes step S610. Otherwise it executes step S612.

In step S610, the controller 304 returns a preset message to inform the host 308 of the uncorrectable situation. The preset message may inform the host 308 that the target logical address LBA is not in the record or the target logical address LBA is cleared.

In step S612, based on the target data D_read, the controller 304 evaluates another cyclic redundancy check code CRC_ref. The controller 304 may input the target data D_read to the CRC engine 320 to generate the cyclic redundancy check code CRC_ref.

In step S614, the controller 304 compares whether the cyclic redundancy check code CRC_ref is identical to the cyclic redundancy check code CRC_read, and if yes, it executes step S616. Otherwise it executes step S610.

In step S616, the controller 304 returns the target data D_read to the host 308. The cyclic redundancy check code CRC_ref is identical to the cyclic redundancy check code CRC_read, which means that the target data D_read is correct and the controller 304 returns the target data D_read to the host 308 to complete the execution of the read command.

The memory controller 304 controlling the flash memory 302 may be implemented in other architectures. Any techniques using the forgoing concepts to operate a flash memory with simplified UNC marking and UNC recognition are within the scope of the present invention. In some exemplary embodiments, control methods for non-volatile memory may be realized based on the foregoing concept.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a non-volatile memory;
   a controller, configured to control the non-volatile memory and comprising a cyclic redundancy check engine,
   wherein,
   in response to an uncorrectable marking command issued by a host, the controller operates the cyclic redundancy check engine to provide a specific cyclic redundancy check code to mark that a logical address segment indicated by the uncorrectable marking command is uncorrectable;
   the controller uses a mapping information format to manage mapping information with each management unit involving a plurality of logical address units;
   the cyclic redundancy check engine assigns the specific cyclic redundancy check code to each logical address unit in the logical address segment to mark all logical address units in the logical address segment as uncorrectable; and
   an uncorrectable marking unit introduced by the uncorrectable marking command is smaller than the management unit introduced by the mapping information format.

2. The data storage device as claimed in claim 1, wherein:
   the controller programs the specific cyclic redundancy check code to the non-volatile memory for each logical address unit in the logical address segment; and
   the specific cyclic redundancy check code is programmed to a metadata area of the non-volatile memory.

3. The data storage device as claimed in claim 2, wherein:
   in response to a read command issued by the host, the controller reads the non-volatile memory to get read data and get read cyclic redundancy check code;
   when the cyclic redundancy check engine determines that the read cyclic redundancy check code is identical to the specific cyclic redundancy check code, the controller informs the host that uncorrectable data is being requested by the read command.

4. The data storage device as claimed in claim 3, wherein:
   when the cyclic redundancy check engine determines that the read cyclic redundancy check code is different from the specific cyclic redundancy check code and fails cyclic redundancy checking, the controller returns a cyclic redundancy check failure message to the host.

5. The data storage device as claimed in claim 4, wherein:
   when the cyclic redundancy check engine determines that the read cyclic redundancy check code is different from the specific cyclic redundancy check code and passes the cyclic redundancy checking, the controller returns the read data to the host.

6. A control method for a non-volatile memory, comprising:
   in response to an uncorrectable marking command issued by a host, operating a cyclic redundancy check engine to provide a specific cyclic redundancy check code;
   marking that a logical address segment indicated by the uncorrectable marking command is uncorrectable by using the specific cyclic redundancy check code; and
   managing mapping information in a mapping information format with each management unit involving a plurality of logical address units,
   wherein,
   the cyclic redundancy check engine assigns the specific cyclic redundancy check code to each logical address unit in the logical address segment to mark all logical address units in the logical address segment as uncorrectable; and
   an uncorrectable marking unit introduced by the uncorrectable marking command is smaller than the management unit introduced by the mapping information format.

7. The control method as claimed in claim 6, further comprising:
   programming the specific cyclic redundancy check code to the non-volatile memory for each logical address unit in the logical address segment,
   wherein,
   the specific cyclic redundancy check code is programmed to a metadata area of the non-volatile memory.

8. The control method as claimed in claim 7, further comprising:
   in response to a read command issued by the host, reading the non-volatile memory to get read data and get read cyclic redundancy check code; and
   when the cyclic redundancy check engine determines that the read cyclic redundancy check code is identical to the specific cyclic redundancy check code, informing the host that uncorrectable data is being requested by the read command.

9. The control method as claimed in claim 8, wherein:
   when the cyclic redundancy check engine determines that the read cyclic redundancy check code is different from the specific cyclic redundancy check code and fails cyclic redundancy checking, a cyclic redundancy check failure message is returned to the host.

10. The data storage device as claimed in claim 9, wherein:

when the cyclic redundancy check engine determines that the read cyclic redundancy check code is different from the specific cyclic redundancy check code and passes the cyclic redundancy checking, the read data is returned to the host.

\* \* \* \* \*